(12) United States Patent
Fukunaga

(10) Patent No.: US 7,176,525 B2
(45) Date of Patent: Feb. 13, 2007

(54) PROCESS FOR PRODUCTION OF SOI SUBSTRATE AND PROCESS FOR PRODUCTION OF SEMICONDUCTOR DEVICE

(75) Inventor: Takeshi Fukunaga, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/075,687

(22) Filed: Mar. 10, 2005

(65) Prior Publication Data

US 2005/0151201 A1    Jul. 14, 2005

Related U.S. Application Data

(62) Division of application No. 10/632,930, filed on Aug. 4, 2003, now Pat. No. 6,875,633, which is a division of application No. 09/907,911, filed on Jul. 19, 2001, now Pat. No. 6,602,761, which is a division of application No. 09/356,704, filed on Jul. 20, 1999, now Pat. No. 6,271,101.

(30) Foreign Application Priority Data

Jul. 29, 1998    (JP)    ................... 10-214125

(51) Int. Cl.
  H01L 29/76    (2006.01)
  H01L 29/94    (2006.01)
  H01L 31/62    (2006.01)
  H01L 31/113    (2006.01)
  H01L 31/119    (2006.01)

(52) U.S. Cl. ............ 257/344; 257/327; 257/336; 257/347; 257/348; 257/349; 257/350; 257/351; 257/352; 257/353; 257/354; 257/377; 257/382; 257/384; 257/408

(58) Field of Classification Search ........ 257/347–354, 257/327, 336, 344, 377, 382, 384, 408
See application file for complete search history.

(56) References Cited

U.S. PATENT DOCUMENTS

| | | | |
|---|---|---|---|
| 4,753,896 A | | 6/1988 | Matloubian |
| 4,899,202 A | * | 2/1990 | Blake et al. ............. 257/336 |
| 5,215,931 A | * | 6/1993 | Houston .................. 438/151 |
| 5,243,213 A | | 9/1993 | Miyazawa et al. |

(Continued)

OTHER PUBLICATIONS

A.J. Auberton-Herve et al., Industrial Research Society (Kogyo Chosa Kai); Electronic Material, pp. 83-87, Aug. 1997.

(Continued)

*Primary Examiner*—Ida M. Soward
(74) *Attorney, Agent, or Firm*—Nixon Peabody LLP; Jeffrey L. Costellia

(57) ABSTRACT

A process for producing an adhered SOI substrate without causing cracking and peeling of a single-crystal silicon thin film. The process consists of selectively forming a porous silicon layer in a single-crystal semiconductor substrate, adding hydrogen into the single-crystal semiconductor substrate to form a hydrogen-added layer, adhering the single-crystal semiconductor substrate to a supporting substrate, separating the single-crystal semiconductor substrate at the hydrogen-added layer by thermal annealing, performing thermal annealing again to stabilize the adhering interface, and selectively removing the porous silicon layer to give single-crystal silicon layer divided into islands.

10 Claims, 7 Drawing Sheets

U.S. PATENT DOCUMENTS

| | | | |
|---|---|---|---|
| 5,371,037 A | 12/1994 | Yonehara | |
| 5,374,564 A | 12/1994 | Bruel | |
| 5,426,062 A * | 6/1995 | Hwang | 438/154 |
| 5,444,282 A * | 8/1995 | Yamaguchi et al. | 257/344 |
| 5,573,961 A * | 11/1996 | Hsu et al. | 438/163 |
| 5,714,395 A | 2/1998 | Bruel | |
| 5,778,237 A * | 7/1998 | Yamamoto et al. | 713/322 |
| 5,882,987 A | 3/1999 | Srikrishnan | |
| 5,926,430 A * | 7/1999 | Noda et al. | 365/226 |
| 5,985,681 A | 11/1999 | Hamajima et al. | |
| 6,020,252 A | 2/2000 | Aspar et al. | |
| 6,044,474 A * | 3/2000 | Klein | 713/400 |
| 6,049,092 A | 4/2000 | Konuma et al. | |
| 6,171,982 B1 | 1/2001 | Sato | |
| 6,184,556 B1 | 2/2001 | Yamazaki et al. | |
| 6,271,101 B1 | 8/2001 | Fukunaga | |
| 6,294,478 B1 | 9/2001 | Sakaguchi et al. | |
| 6,331,208 B1 | 12/2001 | Nishida et al. | |
| 6,342,433 B1 | 1/2002 | Ohmi et al. | |
| 6,388,291 B1 | 5/2002 | Zhang et al. | |
| 6,420,759 B2 | 7/2002 | Yamazaki et al. | |
| 6,433,361 B1 | 8/2002 | Zhang et al. | |
| 6,583,474 B2 | 6/2003 | Yamazaki et al. | |
| 6,602,761 B2 | 8/2003 | Fukunaga | |
| 6,867,431 B2 | 3/2005 | Konuma et al. | |
| 2004/0256621 A1 | 12/2004 | Konuma et al. | |
| 2005/0142705 A1 | 6/2005 | Konuma et al. | |
| 2005/0153489 A1 | 7/2005 | Konuma et al. | |

OTHER PUBLICATIONS

"A Dissolved Wafer Process Using a Porous Sacrificial Layer and a Lightly-Doped Bulk Silicon Etch-Stop", Bell et al., Micro Electro Mechanical Systems, 1998, MEMS 98, Proceeding., The Eleventh Annual International Workshop on 1998, pp. 251-256.

Stanley Wolf Ph.D, in "Silicon Processing for the VLSI Era", vol. 1: Process Technology, Lattice Press, 1990, pp. 238-239.

"A Dissolved Wafer Process Using a Porous Silicon Sacrificial Layer and a Lightly-Doped Bulk Silicon Etch-Stop", Bell et al., Micro Electro Mechanical Systems, 1998, MEMS 98, Proceeding, The Eleventh Annual International Workshop on 1998, pp. 251-256.

Stanley Wolf Ph.D, in "Silicon Processing for the VLSI Era", vol. 2: Process Technology, Lattice Press, 1990, pp. 238-239.

* cited by examiner

PROCESS FOR PRODUCTION OF SOI SUBSTRATE AND PROCESS FOR PRODUCTION OF SEMICONDUCTOR DEVICE

BACKGROUND OF THE INVENTION

1. Field of the Invention

The present invention relates to a process for production of a thin-film transistor (TFT for short hereinafter) with single-crystal semiconductor thin film formed on a substrate having an insulating surface. The present invention relates also to a process for production of a semiconductor device containing semiconductor circuits constructed of TFTs.

The term "semiconductor device" as used in this specification embraces any device that utilizes semiconductor characteristics for its functions. To be more specific, it includes electro-optical devices typified by liquid crystal displays, semiconductor circuits formed by integration of TFTs, and electronic machines and equipment containing as parts such electro-optical devices and semiconductor circuits.

2. Description of the Relates Art

The recent rapid progress in VLSI technology has yielded SOI (silicon on insulator) which is attracting attention because of its low power consumption. This technology differs from the conventional one in that the bulk single-crystal silicon that forms the active region (or channel-forming region) of FET is replaced by thin-film single-crystal silicon.

An SOI substrate consists of single-crystal silicon and thin film of single-crystal silicon formed thereon, with a buried silicon oxide film interposed between them. There are several known methods for its production. A new technology that is attracting attention is a bonded SOI substrate which is produced by bonding together two silicon substrates. This technology is expected to form thin film of single-crystal silicon on a glass substrate or the like.

The most noticeable among the technologies of bonded SOI substrate is "Smart-Cut" (a registered trademark of SOITEC Co., Ltd.). It utilizes the hydrogen brittleness. For more detail, refer to "Electronic material", pp. 83–87, August, 1997, issued by Kogyo Chosa kai.

The "Smart-Cut" process consists of forming thin film of single-crystal silicon on a silicon substrate as a support by heat treatment in two steps. The first heat treatment is performed at 400–600° C. so as to bring about hydrogen embrittlement and separate thin film of single-crystal silicon, and the second heat treatment is performed at about 1100° C. so as to stabilize the bonding interface.

The disadvantage of this process is that the second heat treatment causes a strong stress to occur in the thin film of single-crystal silicon and this stress causes the thin film of single-crystal silicon to crack and peel at the edges of the silicon substrate. This is a serious problem with "Smart-Cut" process, and an effective solution to it is required.

SUMMARY OF THE INVENTION

The present invention was completed to address the above-mentioned problem. Thus, it is an object of the present invention to provide a process for producing a bonded SOI substrate without causing cracking and peeling to the thin film of single-crystal semiconductor.

The present invention will contribute to the yield and production cost of TFTs formed on an SOI substrate and in turn contribute to the yield and production cost of semiconductor circuits and electro-optical devices with TFTs. Moreover, the present invention will contribute to the yield and production cost of electronic machines equipped with said semiconductor circuits and electro-optical devices.

DESCRIPTION OF THE PREFERRED EMBODIMENTS

Figure 1A:
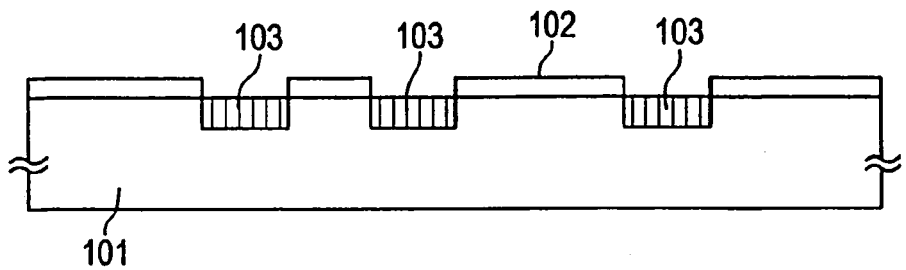
FIGS. 1A to 1D are schematic diagrams showing a process for producing an SOI substrate.

The gist of the present invention resides in a process for producing an SOI substrate which comprises:

a step of forming on the principal surface of a single-crystal semiconductor substrate an insulating film and performing patterning on said insulating film, thereby selectively forming a mask;

a step of converting by anodizing treatment a portion of said single-crystal semiconductor substrate into a porous silicon layer;

a step of removing said mask;

a step of forming on the principal surface of said single-crystal semiconductor substrate and said porous silicon layer a first silicon oxide layer;

a step of adding hydrogen into said single-crystal semiconductor substrate and said porous silicon layer through said first silicon oxide layer, thereby forming a hydrogen-added layer;

a step of adhering together said single-crystal semiconductor substrate and a supporting substrate provided with a second silicon oxide layer thereon;

a step of performing a first heat treatment, thereby separating said single-crystal semiconductor substrate along said hydrogen-added layer;

a step of performing a second heat treatment at 900–1200° C.; and a step of removing the porous silicon layer present near the surface of said supporting substrate.

The above-mentioned process may be modified such that the step of forming said first silicon oxide layer is followed by a step of flattening said first silicon oxide layer. Flattening may be accomplished by chemical mechanical polishing.

Said first heat treatment is carried out at 400–600° C. (typically 500° C.). During this heat treatment, hydrogen embrittlement takes place in the hydrogen-added layer in the direction along the hydrogen-added layer (or the direction parallel to the interface of adhering). The single-crystal semiconductor substrate is separated at this part.

Said second heat treatment is carried out at 900–1200° C. (typically 1050–1150° C.). At temperatures above 1100° C., the stress relaxation of Si—O—Si bonding takes place and the interface of adhering becomes stabilized.

In the above-mentioned process, said second heat treatment should preferably be carried out in a reducing atmosphere (such as hydrogen atmosphere or hydrogen-containing atmosphere). The hydrogen-containing atmosphere is exemplified by a hydrogen-nitrogen mixture and ammonia. The reducing atmosphere is not a restriction on the present invention.

What is most important in the process of the present invention is that the single-crystal semiconductor substrate (from which thin film of single-crystal semiconductor is formed) undergoes stress relaxation before the adhered SOI substrate is produced.

In other words, the vicinity of the principal surface (excluding the region which becomes an active layer afterward) is previously converted into a porous silicon layer, which relieves the stress which is generated by heat treatment when the substrate is adhered. In this way it is possible to prevent the thin film of single-crystal silicon from cracking and peeling by stress.

Therefore, the present invention permits the production of thin film of single-crystal silicon in good yields and hence contributes to yields of SOI substrates and TFTs with SOI substrates. This in turn leads to improved yields and reduced production costs for semiconductor devices with TFT semiconductor circuits.

The invention will be described in more detail with reference to the following examples.

EXAMPLE 1

The process of the invention is explained with reference to FIGS. 1A to 1D and FIGS. 2A to 2C. First, a single-crystal silicon substrate 101 is made available. On its principal surface (on which elements are to be formed) is formed an insulating film, 50 nm thick, (which is a silicon oxide film in this example). The silicon oxide film is patterned to selectively form a mask 102. The silicon oxide film may be replaced by any other insulating film, such as silicon nitride film, silicon oxynitride film, and resist mask.

The mask 102 should cover the part which becomes the active layer of TFT afterward. Also the portion covered by the mask 102 may be used for thin film of single-crystal silicon.

The principal surface of the single-crystal silicon substrate 101 undergoes anodizing treatment, so that a portion of the single-crystal silicon substrate 101 (the exposed region without the mask 102) is converted into a porous silicon layer 103. This anodizing treatment may be carried out in a mixture of hydrofluoric acid and ethanol. The porous silicon layer 103 has minute cylindrical holes in its surface in an approximate density of $10^{11}/cm^2$; however, it retains the same crystalline state (such as orientation) as that of the single-crystal silicon substrate. The porous silicon layer 103 should preferably be formed deeper than necessary for the hydrogen-added layer to be formed later.

The mask 102 is removed, and a first silicon oxide layer 104 is formed on the single-crystal silicon substrate 101 and the porous silicon layer 103. See FIG. 1B.

The forming of the first silicon oxide layer 104 (that follows the removal of the mask 102) may be effectively preceded by heat treatment at 900–1200° C. (preferably 1000–1150° C.) in a reduction atmosphere such as a hydrogen atmosphere, an ammonia atmosphere and an inert atmosphere comprising hydrogen or ammonia (a hydrogen-nitrogen mixture, a hydrogen-argon mixture, etc.).

This heat treatment in a reduction atmosphere blocks the surface openings of the porous silicon layer 103 by movement of silicon atoms. In other words, it provides a very flat layer resembling single-crystal silicon. This flat layer facilitates the formation of uniform silicon oxide layer in the subsequent steps.

The first silicon oxide layer 104 may be formed by any known oxidation method, such as thermal oxidation or plasma oxidation, or by any known gas phase method, such as plasma CVD, low pressure thermal CVD, and sputtering. The first silicon oxide layer 104 thus formed should preferably be flattened by polishing, for example a chemical mechanical polishing or an etch-back process using a dry etching technique.

Figure 1B:
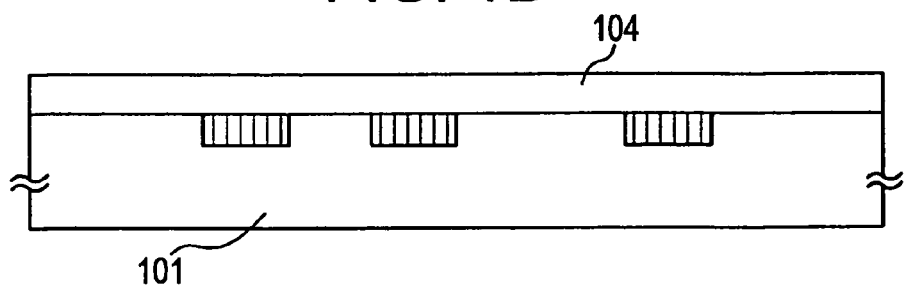
Figure 1C:
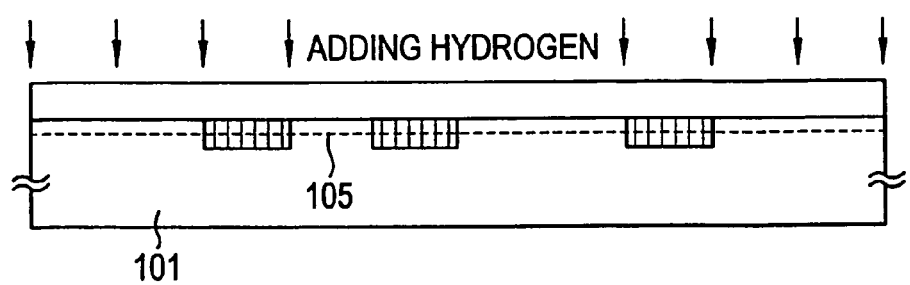
Figure 1D:
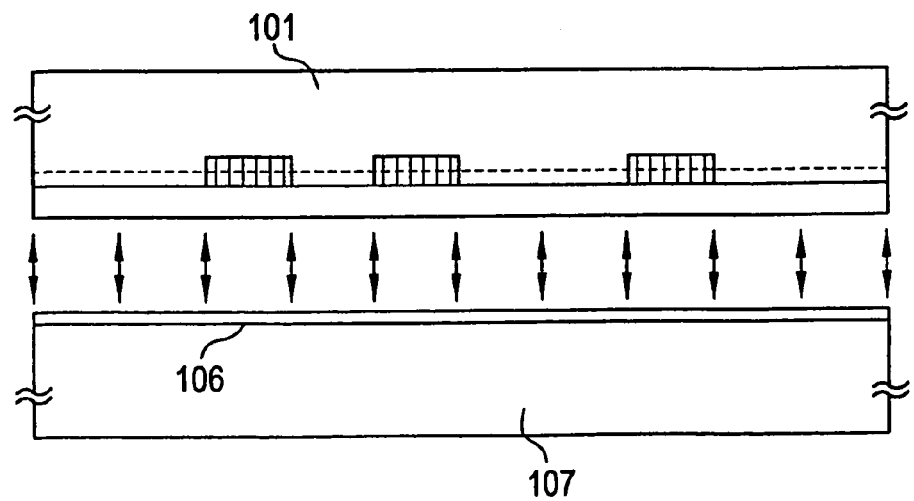

In the state shown in FIG. 1B, hydrogen (to be exact, hydrogen ions) is added to the single-crystal silicon substrate 101 and the porous silicon layer 103 through the first silicon oxide layer 104. This step forms the hydrogen-added layer 105. See FIG. 1C.

The addition of hydrogen ions may be accomplished by means of ion implantation. Of course, it is also possible to employ other means such as plasma doping. In this example, hydrogen ions are added with a dose of $1\times10^{16}$ to $1\times10^{17}$ atoms/cm$^2$.

The depth to which the hydrogen-added layer is formed should be accurately controlled because it determines the thickness of the single-crystal silicon thin film. In this example, the depth of a profile of hydrogen addition is controlled such that a single-crystal silicon layer, 50 nm thick, remains between the principal surface of the single-crystal silicon substrate 101 and the hydrogen-added layer 105.

It is desirable that the hydrogen-added layer 105 traverse the porous silicon layer 103, so that the porous silicon layer is exposed at the time of separation along the hydrogen-added layer in the subsequent step.

Another supporting substrate 107 is made available. It is a ceramic substrate having a second silicon oxide layer 106 formed thereon. This ceramic substrate may be replaced by a quartz substrate, glass ceramic substrate, semiconductor substrate (including both single-crystal and polycrystal), stainless steel substrate, or metal substrate (of Ta, W, Mo, or Ti, or an alloy thereof). The silicon oxide layer on the surface is necessary for adhering to be carried out later.

It is desirable that the above-mentioned supporting substrate have an underlying layer below the second silicon oxide layer 106. This underlying layer may be a metal layer or an aluminum nitride layer which has good thermal conductivity (or heat radiation). It protects the semiconductor device from thermal deterioration.

The second silicon oxide layer 106 may be formed by vapor phase deposition such as low pressure thermal CVD, sputtering, and plasma CVD. It may also be formed by thermal oxidation or plasma oxidation in the case of semiconductor substrate (e.g., single-crystal silicon substrate).

Now, the first substrate (single-crystal silicon substrate) and the second substrate (supporting substrate) are ready. They are bonded together, with their principal surfaces facing each other. In other words, the first silicon oxide layer 104 and the second silicon oxide layer 106 are adhered together. See FIG. 1D.

Adhering takes place with hydrogen bonds due to moisture on the highly hydrophilic surfaces of the first and second silicon oxide layers.

The first heat treatment is carried out at 400–600° C. (typically 500° C.). This heat treatment causes the microvoids of the hydrogen-added layer 105 to change in volume, so that the single-crystal silicon substrate 101 is separated along the hydrogen-added layer 105. With the single-crystal silicon substrate 101 removed, the first silicon oxide layer 104, the single-crystal silicon layer (thin film) 109, and the porous silicon layer 110 are left on the second silicon oxide layer 106. See FIG. 2A.

The second heat treatment (or furnace annealing) is carried out at 900–1200° C. (typically 1050–1150° C.). This heat treatment relieves the stress due to Si—O—Si bond, thereby stabilizing the adhering interface. As the result, the single-crystal silicon layer 109 is completely adhered to the supporting substrate 107. In this example, this heat treatment is carried out at 1100° C. for 2 hours in an atmosphere comprising hydrogen or an oxidizing atmosphere. See FIG. 2B.

Figure 2A:
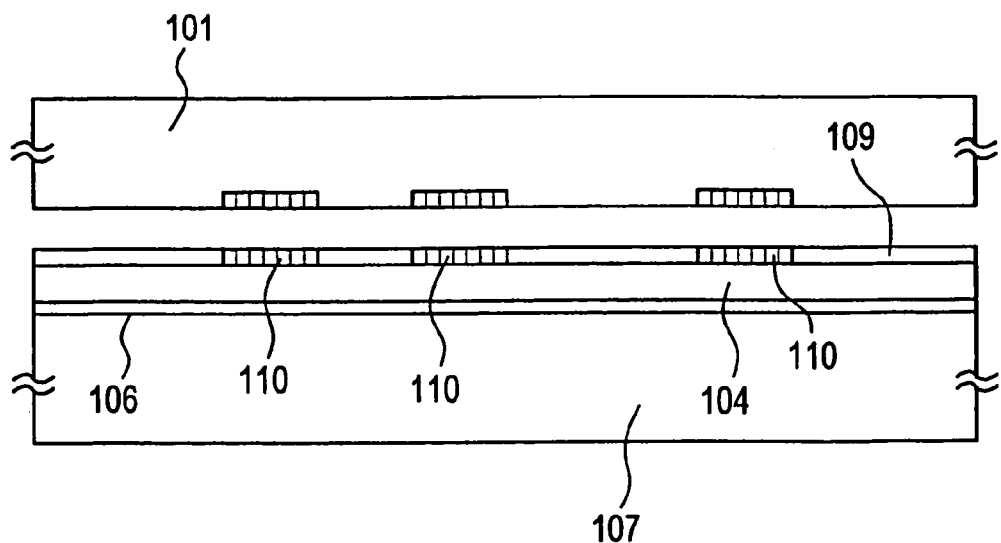
FIGS. 2A to 2C are schematic diagrams showing a process for producing an SOI substrate.
Figure 2B:
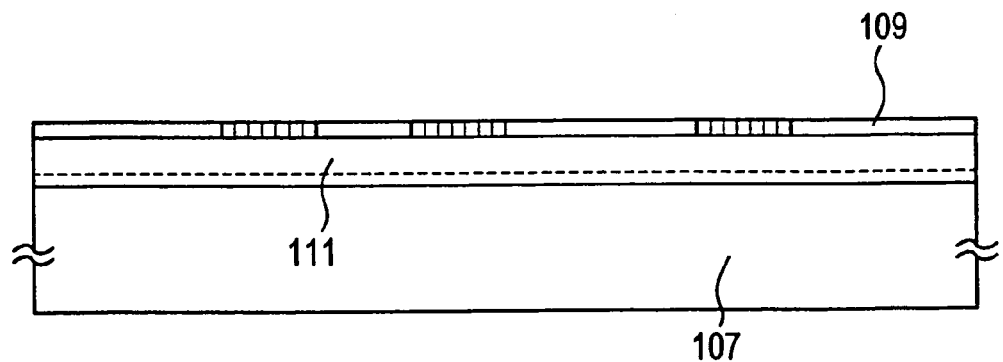

As the bonding interface becomes stabilized, the buried insulating layer 111 is defined. In FIG. 2B, the broken line in the buried insulating layer 111 denotes the adhering interface where firm adhering has taken place.

Polishing is performed to flatten the surface of the single-crystal silicon layer 109 and the porous silicon layer 110. The chemical mechanical polishing is employed in this example, although any other known polishing methods may be used.

Wet etching is performed to selectively remove the porous silicon layer 110 present near the surface of the supporting substrate 107 (or in the single-crystal silicon layer 109). A preferred etchant for this etching is a mixed aqueous solution of hydrofluoric acid and hydrogen peroxide. It is reported that a 1:5 mixed solution of 49% HF and 30% $H_2O_2$ has a selective ratio greater than 100,000 for the single-crystal silicon layer and the porous silicon layer.

Figure 2C:
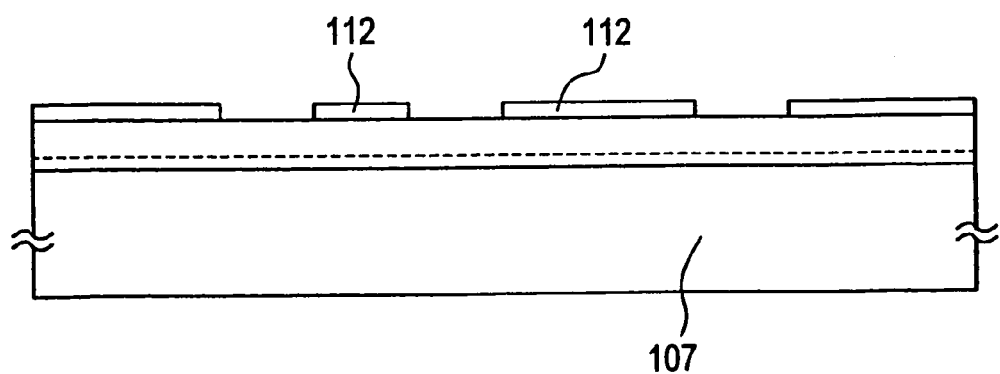

The wafer up to this stage is shown in FIG. 2C. The ceramic substrate (supporting substrate) 107 has the buried insulating layer 111, on which is the single-crystal silicon layer 112 divided into a plurality of islands.

The SOI substrate is now completed. However, it should preferably undergo heat treatment at 900–1200° C. (typically 1050–1150° C.) in a reducing atmosphere (hydrogen or hydrogen-containing atmosphere) to smooth out the surface of the single-crystal silicon layer 112 on which there still exist minute irregularities. This heat treatment reduces the naturally occurred oxide film, promoting the surface diffusion of silicon atoms, thereby giving rise to a smooth surface.

This heat treatment also effectively reduces the content of impurities in the single-crystal silicon layer 112 by the action of hydrogen atoms to help impurities to diffuse into the gas phase. The Impurities are phosphorus and boron which are originally contained in the single-crystal silicon substrate 101.

Thus there is obtained the desired SOI substrate constructed such that a single-crystal silicon thin film divided into islands is formed on a supporting substrate having an insulating surface. This example offers the advantage of preventing cracking and peeling due to stress because the porous silicon layer 110 functions as a stress relaxing layer in the heat treatment step (shown in FIG. 2B) for bonding. This leads to greatly improved yields in the production of SOI substrates.

EXAMPLE 2

This example demonstrates, with reference to FIG. 3, the fabrication of TFT on the single-crystal silicon layer (in an island shape) which was formed by the process in Example 1.

First, the single-crystal silicon layer (in an island shape) is formed according to the process of Example 1. It is covered with a gate insulating film 302 of silicon oxide (120 nm thick) by plasma CVD. Then, a gate electrode 303 of n-type polysilicon is formed. See FIG. 3A.

Doping is performed to impart the n-type or p-type by the self-alignment process which employs the gate electrodes 303 as a mask. (In this example to fabricate n-type TFTs, the dopant is phosphorus. For p-type TFTs, the dopant is boron.) This step forms the impurity region 304. See FIG. 3B.

That part of the silicon layer which is just under the gate electrode may be doped with an impurity for reverse conductivity type (for example, boron in the case of n-type TFT) so as to control the threshold value of TFT. This doping may be accomplished through the gate electrode or previously before the gate electrode is formed.

On the gate electrode 303 is formed a side wall (side spacer) 305 of silicon oxide by any known anisotropic etching. Alternatively, a side wall of silicon nitride may be formed on a silicon oxide film which has previously been formed on the gate electrode 303 by plasma oxidation.

Doping with phosphorus is performed again so as to form a region in which the concentration of impurity is higher than the above-mentioned impurity region 304. As the result of these two doping steps, there are defined the source region 306, the drain region 307, the LDD (lightly doped drain) region 308, and the channel forming region 309. See FIG. 3C.

Annealing is performed to activate the impurity which has been added in the previous step and to restore the damaged silicon layer which has resulted from doping. This annealing may be furnace annealing, laser annealing, or lamp annealing, or a combination thereof.

Figure 3A:
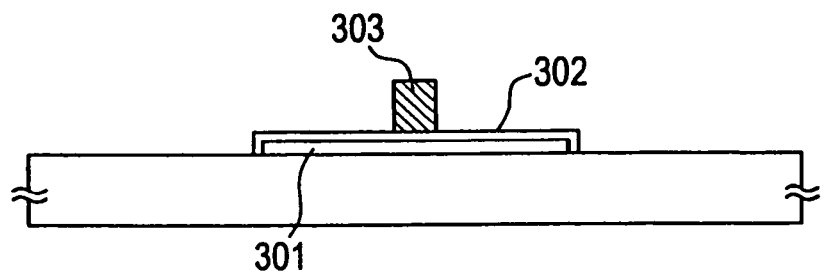
FIGS. 3A to 3D are schematic diagrams showing a process for producing a TFT.
Figure 3B:
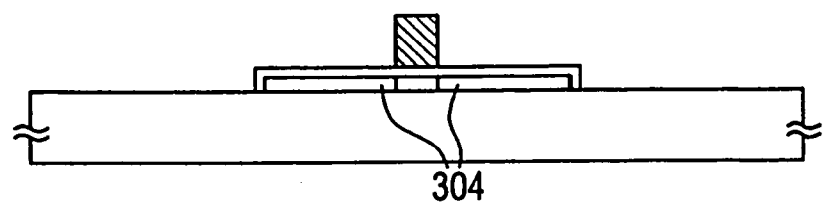
Figure 3C:
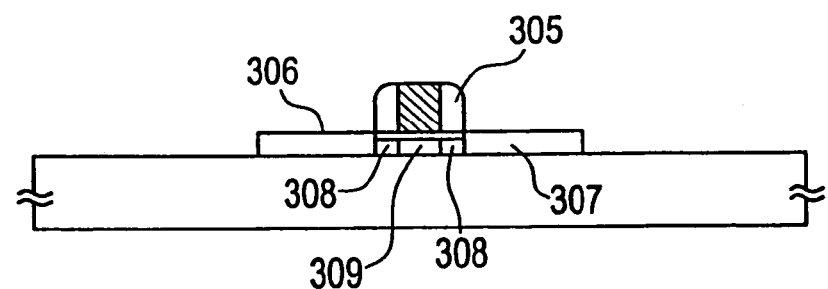

The wafer shown in FIG. 3C is entirely covered with a cobalt film (not shown), which subsequently undergoes thermal annealing. Thus, a cobalt silicide layer 310 is formed. Incidentally, this cobalt film may be replaced by titanium film or tungsten film. This step is known and hence its detailed description is omitted.

An interlayer insulating film 311 (1 μm thick) is formed from a resin material, such as polyimide, acrylate, polyamide, polyimideamide, and benzocyclobutene (BCB). This insulating film may be silicon oxide film, silicon nitride film, or silicon oxynitride film. The insulating film of resin material may be combined with the insulating film of silicon oxide or the like.

Contact holes are made in the interlayer insulating film 311, and the source wiring 312 and the drain wiring 313 are formed from aluminum. Finally, furnace annealing is performed (for hydrogenation) on the entire element in a hydrogen atmosphere at 350° C. for 2 hours.

Figure 3D:
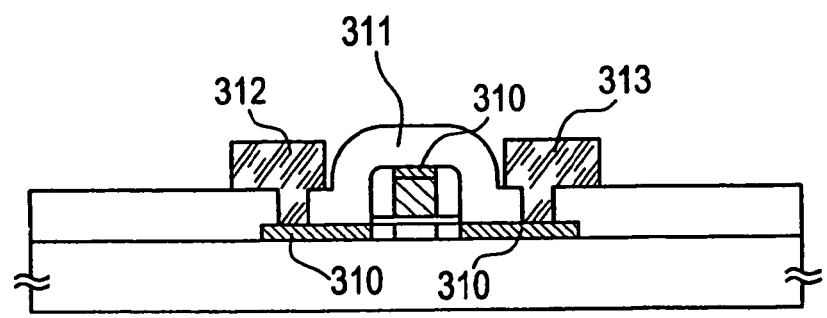

Thus there is obtained a TFT as shown in FIG. 3D. This example merely illustrates one TFT structure and the application of the present invention is not limited to it. In other words, the present invention may be applied to any known structures with respect to the TFT.

The structure shown in FIG. 3D may be used to form a pixel switching element for the active matrix display unit if the drain wiring 313 is electrically connected to a pixel electrode (not shown) by any known means.

In other words, the present invention is effective for production of electro-optical apparatus such as liquid crystal display units and electroluminescence (EL) display units.

As mentioned above, the present invention may be applied to TFTs of any structure or a variety of semiconductor circuits. That is, the present invention may be applied to any semiconductor devices with TFTs and other semiconductor circuits.

EXAMPLE 3

This example demonstrates a liquid crystal display unit (FIG. 4) with TFT semiconductor circuits fabricated by the process in Example 2. The pixel TFT (or pixel switching element) and the cell assembly may be produced by any known method; therefore, their detailed description is omitted.

Figure 4:
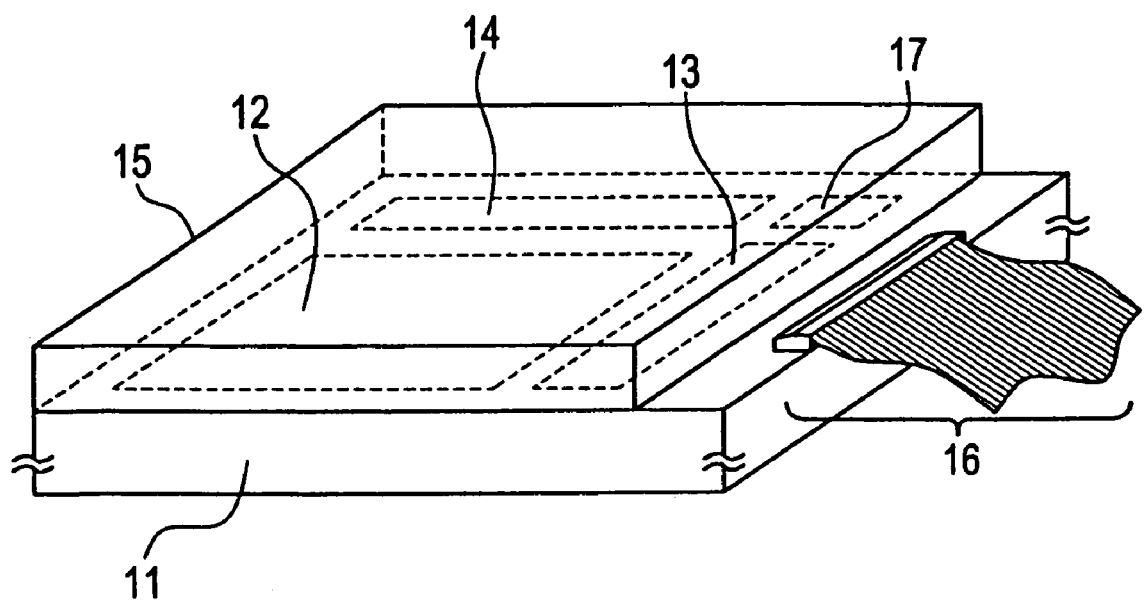
FIG. 4 is a schematic diagram showing a structure of an electro-optical device.

In FIG. 4, there are shown a supporting substrate (with an insulating surface) 11, a pixel matrix circuit 12, a source driver circuit 13, a gate driver circuit 14, a counter substrate 15, a FPC (flexible printed circuit) 16, and a signal processing circuit 17.

The signal processing circuit 17 contains such processing circuits as D/A converter, gamma-correcting circuit, and signal splitting circuit, which used to be formed in an IC. Signal processing may be accomplished by means of an IC chip (with MOSFETs conventionally fabricated on a single-crystal silicon substrate) on the supporting substrate.

Although this example demonstrates a liquid crystal display unit, the present invention may be applied to any electroluminescence (EL) display unit and electrochromic (EC) display unit of active matrix type.

This example demonstrates merely a liquid crystal display unit; the application of the present invention is not limited to it.

EXAMPLE 4

The present invention can be applied to the entire IC technologies or to all the semiconductor circuits now on the market. For example, it can be applied to microprocessors (such as RISC processors and ASIC processors which are integrated on one chip), signal processing circuits (such as D/A converters), and high-frequency circuits for portable equipment (such as pocket telephones, PHS, and mobile computers).

Figure 5A:
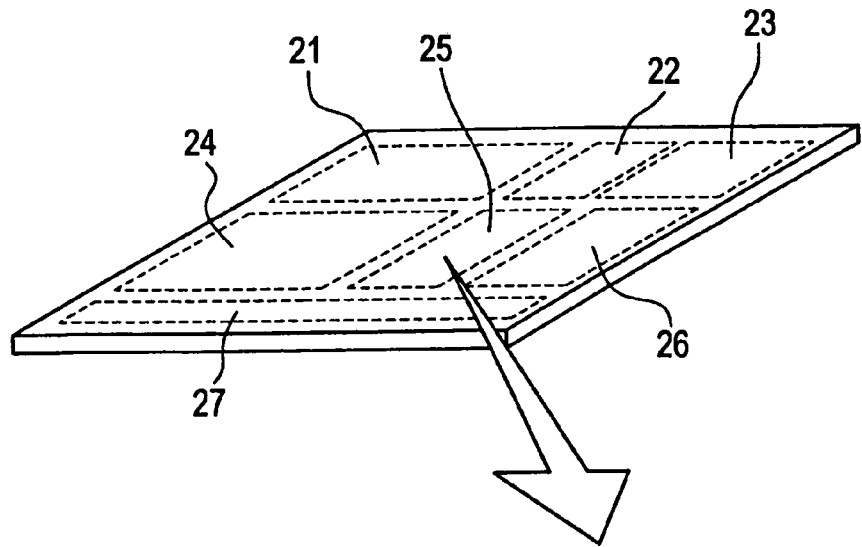
FIGS. 5A to 5C are schematic diagrams showing a structure of a semiconductor circuit.

FIG. 5A shows one example of microprocessors, which is typically composed of a CPU core 21, RAM 22, clock controller 23, cache memory 24, cache controller 25, serial interface 26, and I/O port 27.

Figure 5B:
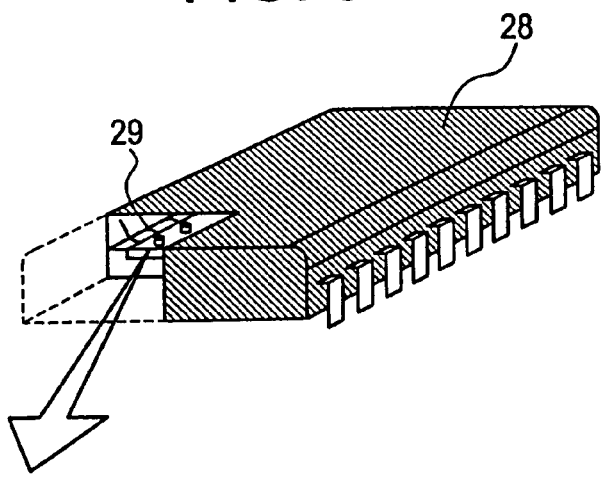

Actual microprocessors greatly vary in circuit design depending on their use. (FIG. 5A is a schematic diagram.) The central part of any microprocessor is an IC (Integrated Circuit) 28 shown in FIG. 5B. The IC 28 has integrated circuits formed on a semiconductor chip 29 and protected by ceramic or the like.

Figure 5C:
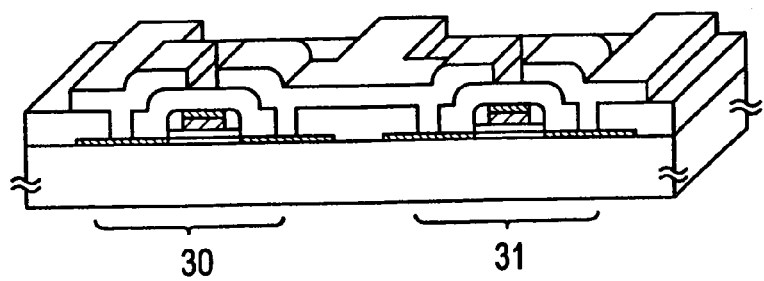

The integrated circuits (or semiconductor circuits) formed on a semiconductor chip 29 accord with the present invention. In this example, the basic unit of the semiconductor circuits is the CMOS circuit composed of an n-channel TFT 30 and a p-channel TFT 31 as shown in FIG. 5C. This structure saves power consumption.

The microprocessor shown in this example is used as an essential part for various electronic machines and equipment, such as personal computers, portable information terminals, home appliances, and automotive and vehicular controllers.

EXAMPLE 5

The present invention may be used to form CMOS circuits and pixel matrix circuits. These circuits may be used for various electro-optical apparatuses (such as liquid crystal display of active matrix type, EL display of active matrix type, and EC display of active matrix type). In other words, the present invention can be applied to any electronic machines and apparatus equipped with these electro-optical devices as display media.

Examples of these electronic machines and apparatus include video cameras, digital cameras, projectors (of rear type or front type), head-mount display (goggle-type display), car navigation, personal computer, and mobile information terminals (mobile computers, pocket telephones, and electronic books). They are illustrated in FIGS. 6A to 6F and 7A to 7D.

Figure 6A:
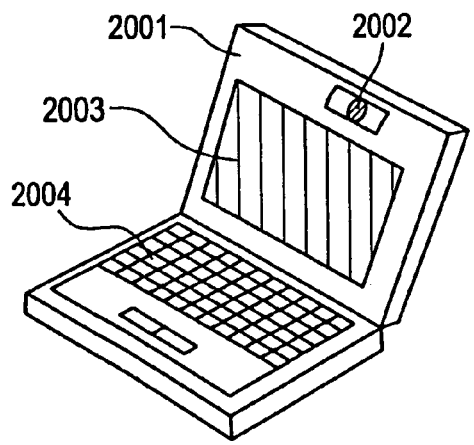
FIGS. 6A to 6F are schematic diagrams showing various electronic apparatus.

FIG. 6A shows a personal computer which consists of a main body 2001, an image input 2002, a display unit 2003, and a keyboard 2004. The present invention may be applied to the image input 2002 and the display unit 2003 and other signal control circuits.

Figure 6B:
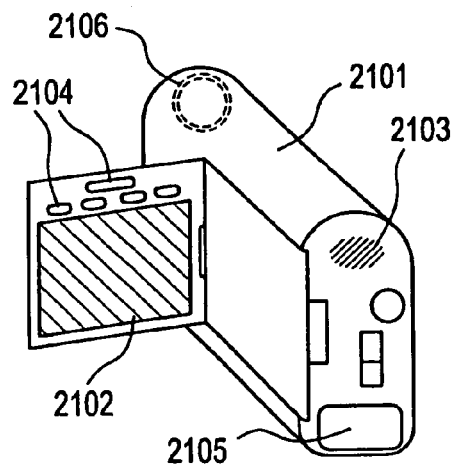

FIG. 6B shows a video camera which consists of a main body 2101, a display 2102, an audio input unit 2103, a switching unit 2104, a battery 2105, and an image receiver 2106. The present invention may be applied to the display unit 2102 and the video input 2103 and other signal control circuits.

Figure 6C:
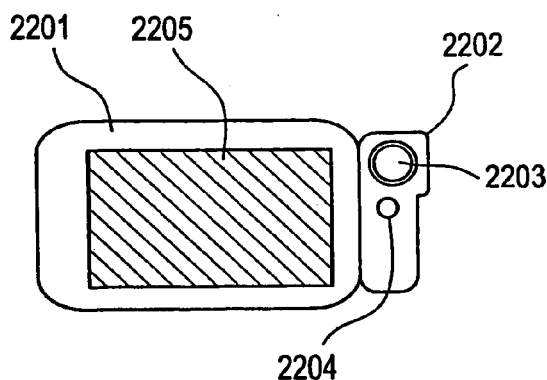

FIG. 6C shows a mobile computer which consists of a main body 2201, a camera unit 2202, an image receiver 2203, a switching unit 2204, and a display unit 2205. The present invention may be applied to the display unit 2205 and other signal control circuits.

Figure 6D:
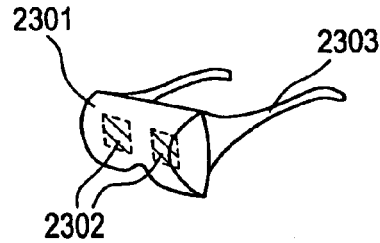

FIG. 6D shows a goggle type display which consists of a main body 2301, a display unit 2302, and arms 2303. The present invention may be applied to the display unit 2302 and other signal control circuits.

Figure 6E:
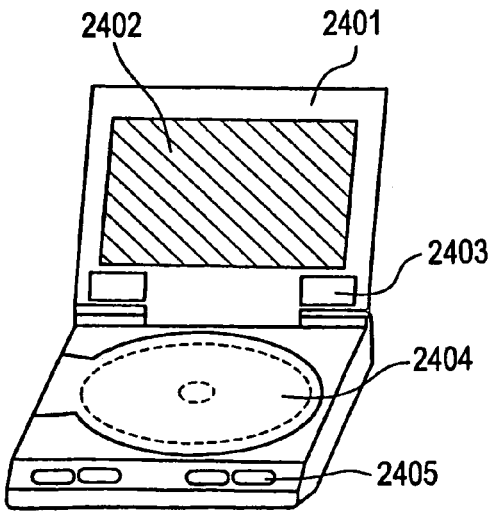

FIG. 6E shows a player for a recording medium recorded programs, which consists of a main body 2401, a display unit 2402, a speaker 2403, a recording medium 2404, and a switching unit 2405. Incidentally, this apparatus may employ a DVD (digital versatile disc) or CD as the recording medium. It is used to enjoy music and movies and internet. The present invention may be applied to the display unit 2402 and other signal control circuits.

Figure 6F:
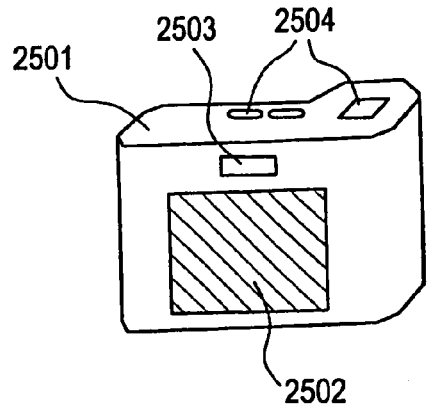

FIG. 6F shows a digital camera which consists of a main body 2501, a display unit 2502, an eyepiece 2503, a switching unit 2504, and an image receiver (not shown). The present invention may be applied to the display unit 2502 and other signal control circuits.

Figure 7A:
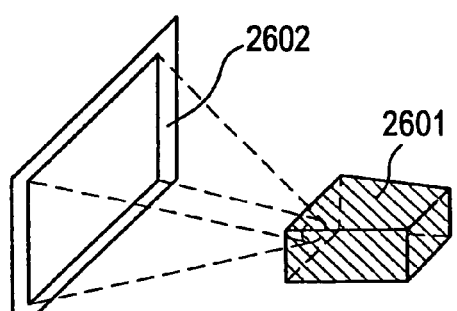
FIGS. 7A to 7D are schematic diagrams showing various electronic apparatus.

FIG. 7A shows a front-type projector which consists of a display unit 2601 and a screen 2602. The present invention may be applied to the display unit and other signal control circuits.

Figure 7B:
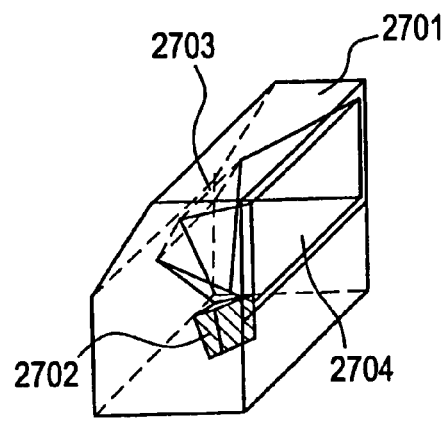

FIG. 7B is a rear-type projector which consists of a main body 2701, a display unit 2702, a mirror 2703, and a screen 2704. The present invention may be applied to the display and other signal control circuits.

Figure 7C:
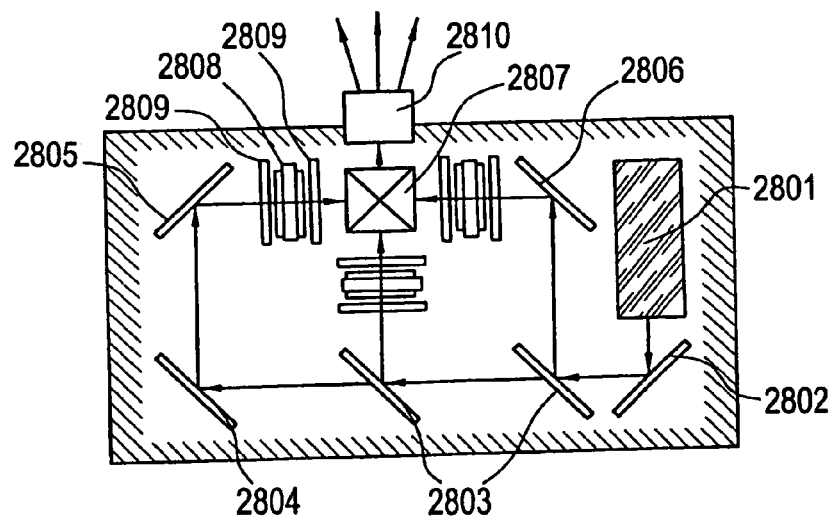

FIG. 7C shows an example of the structure of the display units 2601 and 2702 in FIGS. 7A and 7B, respectively. The display units 2601 and 2702 each consist of an optical system for light source 2801, mirrors 2802, 2804, 2805 and 2806, a dichroic mirror 2803, a prism 2807, a liquid crystal display unit 2808, a phase difference plate 2809, and a projecting optical system 2810. The projecting optical system 2810 contains projector lenses. This example shows the one which contains three plates. The one which has a single plate may also be possible. Incidentally, the example shown in FIG. 7C may be modified such that the arrowed optical paths may be provided with such optical elements as lenses, polarizing film, phase difference adjusting film, and IR film.

Figure 7D:
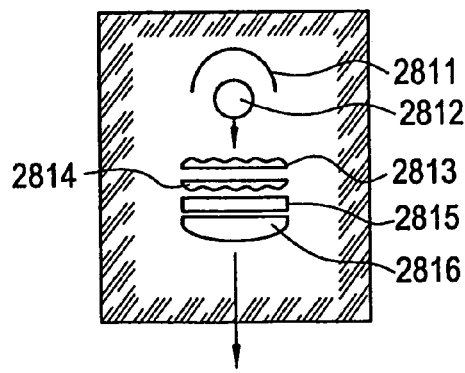

FIG. 7D shows an example of the structure of the light source optical system 2801 in FIG. 7C. The light source optical system 2801 consists of a reflector 2811, a light source 2812, lens arrays 2813 and 2814, a polarizing light converting element 2815, and a condenser lens 2816. The light source optical system shown in FIG. 7D is illustrative only but is not limitative. For example, the light source optical system may be provided with such optical elements as lenses, polarizing film, phase difference adjusting film, and IR film.

As mentioned above, the present invention may be applied to a broad range of fields, including almost all electronic machines and equipment. And, the electronic machines and equipment in this example may be realized by any combination of Examples 1 to 4.

[Effect of the invention] According to the present invention, it is possible to produce thin film of single-crystal silicon by Smart-Cut method without causing cracking and peeling to the thin film of single-crystal silicon during heat treatment. In other words, the present invention greatly contributes to yields and production cost of SOI substrates.

This in turn leads to improved yields and reduced production costs of semiconductor devices with TFT semiconductor circuits.

What is claimed is:

1. A microprocessor comprising:
   a CPU,
   a cache memory,
   a cache controller,
   a RAM,
   a clock controller,
   a serial interface, and
   an IC, said IC comprising:
   a substrate having an insulating surface,
   a semiconductor film comprising silicon over said substrate, said semiconductor film including a channel region;
   a pair of LDD regions in said semiconductor film with said channel region therebetween wherein said pair of LDD regions contain an impurity of one conductivity type at a first concentration;
   a pair of impurity regions in said semiconductor film adjacent to said pair of LDD regions wherein said pair of impurity regions contain an impurity of the same conductivity type at a second concentration higher than said first concentration;
   a gate electrode over said channel region with a gate insulating film therebetween wherein said gate electrode partly overlaps each of said pair of LDD regions,
   side walls formed on side surfaces of said gate electrode, and
   wherein each of said pair of impurity regions comprises a metal silicide.

2. The microprocessor according to claim 1 wherein said metal silicide is a silicide of a metal selected from the group consisting of cobalt, titanium, and tungsten.

3. A microprocessor comprising:
   a CPU,
   a cache memory,
   a cache controller,
   a RAM,
   a clock controller,
   a serial interface, and
   an IC, said IC comprising:
   a substrate having an insulating surface,
   an underlying layer comprising aluminum nitride over said substrate,
   a semiconductor film comprising silicon over said underlying layer, said semiconductor film including a channel region;
   a pair of LDD regions in said semiconductor film with said channel region therebetween wherein said pair of LDD regions contain an impurity of one conductivity type a first concentration;
   a pair of impurity regions in said semiconductor film adjacent to said pair of LDD regions wherein said pair of impurity regions contain an impurity of the same conductivity type at a second concentration higher than said first concentration;
   a gate electrode over said channel region with a gate insulating film therebetween wherein said gate electrode partly overlaps each of said pair of LDD regions,
   side walls formed on side surface of said gate electrode, and
   wherein each of said pair of impurity regions comprises a metal silicide.

4. The microprocessor according to claim 3 wherein said metal silicide is a silicide of a metal selected from the group consisting of cobalt, titanium, and tungsten.

5. A microprocessor comprising:
   a CPU,
   a cache memory,
   a cache controller,
   a RAM,
   a clock controller,
   a serial interface, and
   an IC, said IC comprising:
   a substrate having an insulating surface,
   a semiconductor film comprising silicon over said substrate, said semiconductor film including a channel region;
   a pair of LDD regions in said semiconductor film with said channel region therebetween wherein said pair of LDD regions contain an impurity of one conductivity type a first concentration;
   a pair of impurity regions in said semiconductor film adjacent to said pair of LDD regions wherein said pair of impurity regions contain an impurity of the same conductivity type at a second concentration higher than said first concentration;
   a gate electrode over said channel region with a gate insulating film therebetween wherein said gate electrode partly overlaps each of said pair of LDD regions,
   side walls formed on side surface of said gate electrode,
   an interlayer insulating film comprising a resin over said gate electrode, and
   wherein each of said pair of impurity regions comprises a metal silicide.

6. The microprocessor according to claim 5 wherein said metal silicide is a silicide of a metal selected from the group consisting of cobalt, titanium, and tungsten.

7. The microprocessor according to claim 6 wherein said resin is a resin material selected from the group consisting of polyimide, acrylate, polyamide, poly imideamide, and benzocyclobutene (BCB).

8. The microprocessor according to claim 1, wherein the microprocessor is incorporated into an electronic equipment selected from the group consisting of a computer, a display media, a video camera, a digital camera, a projector, a head-mount display, a car navigation, a portable information terminal, a home appliance, a automotive, and vehicular controllers.

9. The microprocessor according to claim 3, wherein the microprocessor is incorporated into an electronic equipment selected from the group consisting of a computer, a display media, a video camera, a digital camera, a projector, a head-mount display, a car navigation, a portable information terminal, a home appliance, a automotive, and vehicular controllers.

10. The microprocessor according to claim 5, wherein the microprocessor is incorporated into an electronic equipment selected from the group consisting of a computer, a display media, a video camera, a digital camera, a projector, a head-mount display, a car navigation, a portable information terminal, a home appliance, a automotive, and vehicular controllers.

* * * * *